(12) United States Patent
Hayashi et al.

(10) Patent No.: US 7,736,821 B2
(45) Date of Patent: Jun. 15, 2010

(54) REFLECTIVE MASK BLANK FOR EUV LITHOGRAPHY AND SUBSTRATE WITH A CONDUCTIVE FILM FOR THE MASK BLANK

(75) Inventors: Kazuyuki Hayashi, Tokyo (JP); Takashi Sugiyama, Tokyo (JP); Masaki Mikami, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 543 days.

(21) Appl. No.: 11/566,883

(22) Filed: Dec. 5, 2006

(65) Prior Publication Data

US 2007/0160874 A1 Jul. 12, 2007

(30) Foreign Application Priority Data

Dec. 12, 2005 (JP) ............................. 2005-357858

(51) Int. Cl.
*G03F 1/00* (2006.01)
(52) U.S. Cl. .......................................... 430/5; 428/430
(58) Field of Classification Search ................... 430/5; 216/24; 428/430, 698
See application file for complete search history.

(56) References Cited

U.S. PATENT DOCUMENTS

| | | | |
|---|---|---|---|
| 2002/0076625 A1* | 6/2002 | Shoki et al. ..................... | 430/5 |
| 2004/0106051 A1 | 6/2004 | Kamm | |
| 2004/0234870 A1 | 11/2004 | Aschke et al. | |
| 2005/0208389 A1* | 9/2005 | Ishibashi et al. ................ | 430/5 |
| 2005/0238922 A1 | 10/2005 | Kinoshita et al. | |
| 2005/0244722 A1* | 11/2005 | Okada et al. ..................... | 430/5 |
| 2007/0160916 A1* | 7/2007 | Ikuta et al. ....................... | 430/5 |

FOREIGN PATENT DOCUMENTS

| | | |
|---|---|---|
| EP | 1 475 663 A2 | 11/2004 |
| JP | 54-108701 | 8/1979 |
| JP | 62-183463 | 8/1987 |
| JP | 3-187733 | 8/1991 |
| JP | 2000-3845 | 1/2000 |
| JP | 2003-501823 | 1/2003 |

(Continued)

OTHER PUBLICATIONS

Wolfram Gissler, et al., "Titanium Implantation into Boron Nitride Films and Ion-Beam Mixing of Titanium-Boron Nitride Multilayers", Ceramics International, XP004040503, vol. 22, No. 4, Jan. 1, 1996, pp. 335-340.

(Continued)

*Primary Examiner*—Mark F Huff
*Assistant Examiner*—Stewart A Fraser
(74) *Attorney, Agent, or Firm*—Oblon, Spivak, McClelland, Maier & Neustadt, L.L.P.

(57) ABSTRACT

To provide a substrate with a conductive film for an EUV mask blank having an increased surface hardness, and a substrate with a reflective multilayer film and an EUV mask blank using such a substrate with a conductive film.

A substrate with a conductive film to be used for production of a reflective mask blank for EUV lithography, characterized in that the chief material of the conductive film is at least one member selected from the group consisting of Cr, Ti, Zr, Nb, Ni and V, and the conductive film contains B (boron) at an average concentration of from 1 to 70 at %.

14 Claims, 1 Drawing Sheet

FOREIGN PATENT DOCUMENTS

| | | |
|---|---|---|
| JP | 2004-320035 | 11/2004 |
| JP | 2005-210093 | 8/2005 |
| JP | 2006-173490 | 6/2006 |

OTHER PUBLICATIONS

Gianpietro Van De Goor, et al., "Electrically Conductive Ceramic Composites", Solid State Ionics, XP004103752, vol. 101-103 No. 2002, Nov. 1, 1997, pp. 1163-1170.

U.S. Appl. No. 12/034,319, filed Feb. 20, 2008, Sugiyama.

U.S. Appl. No. 12/198,912, filed Aug. 27, 2008, Hayashi, et al.

Kiichi Oda, et al., "Characterization and Properties of the Films in the System Nb-B", Journal of Material Science, 21, 1986, pp. 3648-3652.

U.S. Appl. No. 12/483,785, filed Jun. 12, 2009, Hayashi, et al.

\* cited by examiner

REFLECTIVE MASK BLANK FOR EUV LITHOGRAPHY AND SUBSTRATE WITH A CONDUCTIVE FILM FOR THE MASK BLANK

BACKGROUND OF THE INVENTION

1. Field of the Invention

The present invention relates to a reflective mask blank for EUV (Extreme Ultra Violet) lithography (hereinbelow, referred to as "EUV mask blank" in this Description) to be used for semiconductor manufacturing or the like, and a substrate with a conductive film to be used for production of the mask blank.

2. Discussion of Background

In the semiconductor industry, a photolithography method using visible light or ultraviolet light has been employed as a technique for writing, on a Si substrate or the like, a fine pattern, which is required for writing an integrated circuit comprising such a fine pattern. However, the conventional exposure techniques using light exposure have been close to the exposure limit while semiconductor devices have had finer patterns at an accelerated pace. In the case of light exposure, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In this Description, it should be noted that the phrase "EUV light" means a ray having a wavelength in a soft X ray region or a vacuum ultraviolet ray region, specifically a ray having a wavelength of about 10 to 20 nm, in particular, of about 13.5 nm±0.3 nm.

It is impossible to use EUV light in conventional dioptric systems as in photolithography using visible light or ultraviolet light since EUV light is apt to be absorbed by any substances and since the refractive index is close to 1 when EUV light is absorbed. For this reason, a catoptric system, i.e., a combination of a reflective photomask and a mirror, is employed in EUV light lithography.

A mask blank is a stacked member for fabrication of a photomask, which has not been patterned yet. When a mask blank is used for a reflective photomask, the mask blank has a structure wherein a substrate made of glass or the like has a reflective layer for reflecting EUV light and an absorbing layer for absorbing EUV light, formed thereon in this order. The reflective layer normally comprises a reflective multilayer film, which comprises high-refractive layers and low-refractive layers alternately stacked to increase a light reflectance when irradiating a film surface with a ray, more specifically when irradiating a film surface with EUV light. The absorbing layer comprises a material having a high absorption coefficient in connection with EUV light, specifically, for example, a material containing Cr or Ta as the main component.

The reflective multilayer film and the absorbing layer are deposited by ion beam sputtering or magnetron sputtering. When the reflective multilayer film and the absorbing layer are deposited, the substrate is supported by a supporting means. Although there are a mechanical chuck and an electrostatic chuck as the supporting means, an electrostatic chuck is preferably used in view of the generation of dust.

Further, an electrostatic chuck is used as a means to support the substrate also at the time of the mask patterning process or during mask handling at the time of light exposure. However, when the substrate has a low dielectric constant and a low conductivity as in a glass substrate, there is a risk that dielectric breakdown is caused since a high voltage is required to be applied in order to obtain a chucking force at the same level as, e.g., a silicon wafer.

In order to solve such a problem, Patent Document 1 discloses a mask substrate having back coating (conductive film) of a material other than conventional Cr, for example, a substance having a higher dielectric constant and a higher conductivity than those of a glass substrate, such as Si, Mo, chromium oxynitride (CrON) or TaSi, as a layer to accelerate electrostatic chucking of the substrate.

However, the mask substrate disclosed in Patent Document 1 has had such drawbacks that film peeling between the glass substrate and the CrON film is likely to occur, thus generating particles during deposition of a reflective multilayer film and an absorbing layer, since the adhesion of the CrON film to the glass substrate is weak. Particularly, in the vicinity of the boundary between the electrostatic chuck and the CrON film, film peeling is likely to occur caused by force applied to the vicinity of the boundary between the electrostatic chuck and the CrON film due to rotation of the substrate.

Further, the mask substrate disclosed in Patent Document 1 has a conductive film formed on the whole of one face including the chamfered face and the side face of the substrate, and accordingly, film peeling is likely to occur especially on the chamfered face and the side face of the substrate due to warpage of the substrate at the time of electrostatic chucking or the like in such a state that the film adhesion is particularly weak by formation of the conductive film on the chamfered face and the side face at a slant.

Further, in the mask substrate disclosed in Patent Document 1, oxygen (O) is contained in the surface of the CrON conductive film, and accordingly abnormal discharge may occur at the time of depositing the reflective multilayer film or the absorbing film depending upon the deposition conditions.

If such film peeling of a conductive film occurs at the time of electrostatic chucking (at the time of film deposition) or if particles are generated by abnormal discharge during film deposition, it is impossible to obtain a high quality product (a substrate with a reflective multilayer film, a reflective mask blank for exposure or a reflective mask for exposure) because of an increase in the formation of defects in the product. In a case where a pattern is written by using a conventional transmission mask for exposure, even when a defect of irregularities is caused on a mask surface, the presence of such a defect seldom have a significant adverse effect since exposure light has a relatively long wavelength, which is in an ultraviolet range (about 157 to about 248 nm). Accordingly, no special recognition has been given as a problem to be solved, to the generation of particles during film deposition. However, when light having a short wavelength such as EUV light is used as exposure light, it is impossible to ignore the generation of particles since even the presence of the defect of fine irregularities has a significant adverse effect to a printed image.

To solve the above problem, Patent Document 2 proposes a substrate with a reflective multilayer film which suppresses, at the time of electrostatic chucking of a substrate with a conductive film, film peeling of the conductive film and generation of particles due to abnormal discharge, a high quality reflective mask blank for exposure with reduced surface defects due to particles, and a high quality reflective mask for exposure without pattern defects due to particles.

The substrate with a reflective multilayer film disclosed in Patent Document 2 has a conductive film formed in a region excluding at least the peripheral portion of the substrate, in order to prevent generation of particles due to film peeling of the conductive film at the substrate peripheral portion. Further, in the substrate with a reflective multilayer film disclosed in Patent Document 2, the surface of the conductive film to be brought into contact with the electrostatic chuck at the time of electrostatic chucking comprises a metal nitride film containing substantially no oxygen (O) in order to prevent generation of abnormal discharge at the time of film deposition of the reflective multilayer film and the absorbing film. Further, in the substrate with a reflective multilayer film disclosed in Patent Document 2, the composition of the material forming the conductive film is changed in the conductive film thickness direction, in order to improve both the adhesion of the conductive film to the substrate and the adhesion between the electrostatic chuck and the substrate and to prevent generation of particles due to film peeling of the conductive film or generation of particles due to rubbing between the electrostatic chuck and the substrate caused by insufficient adhesion between the electrostatic chuck and the substrate. Namely, the conductive film has such a structure that it contains nitrogen (N) on the substrate side, and it contains at least one of oxygen (O) and carbon (C) on the surface side of the conductive film.

Namely, in the substrate with a reflective multilayer film disclosed in Patent Document 2, generation of particles at the time of film deposition is prevented by the following (1) to (4).

(1) Film peeling of the conductive film at the substrate peripheral portion is prevented by not forming the conductive film on the substrate peripheral portion.

(2) Generation of particles at the time of film deposition is prevented by preventing generation of abnormal discharge at the time of film deposition.

(3) Generation of particles due to film peeling of the conductive film at the time of film deposition is prevented by improving adhesion of the conductive film to the substrate.

(4) Generation of particles due to rubbing between the electrostatic chuck and the substrate caused by insufficient adhesion between the electrostatic chuck and the substrate is prevented by improving the adhesion between the electrostatic chuck and the substrate.

Patent Document 1: JP-A-2003-501823
Patent Document 2: JP-A-2005-210093

SUMMARY OF THE INVENTION

The present inventors have found it effective to increase the surface hardness of the conductive film, in order to prevent generation of particles at the time of film deposition, particularly generation of particles due to rubbing between the electrostatic chuck and the substrate. The present invention has been accomplished on the basis of the above discovery, and it is an object of the present invention to provide a substrate with a conductive film for an EUV mask blank having increased surface hardness, without impairing characteristics of the conductive film.

Further, it is an object of the present invention to provide a substrate with a conductive film having both adhesion to the substrate and the surface hardness increased.

Further, it is an object of the present invention to provide a substrate with a conductive film capable of preventing deformation of the substrate due to a stress caused in the film deposited by sputtering in production of an EUV mask blank.

Still further, it is an object of the present invention to provide a substrate with a reflective multilayer film for an EUV mask blank employing the above substrate with a conductive film, and an EUV mask blank.

In order to accomplish the above objects, the present invention provides a substrate with a conductive film to be used for production of a reflective mask blank for EUV lithography, characterized in that the chief material of the conductive film is at least one member selected from the group consisting of Cr, Ti, Zr, Nb, Ni and V, and the conductive film contains B (boron) at an average concentration of from 1 to 70 at % (hereinbelow, referred to as "the substrate with a conductive film of the present invention" in this Description).

In the substrate with a conductive film of the present invention, the conductive film is preferably a gradient composition film wherein the concentration of B in the conductive film changes along the thickness direction of the conductive film so that the average B concentration is low on the substrate side and the average B concentration is high on the surface side.

In the substrate with a conductive film of the present invention, the gradient composition film preferably has an average B concentration of at most 15 at % at a portion within a film thickness of 5 nm from the face on the substrate side, and an average B concentration of from 1 to 70 at % at a portion within at least a film thickness of 5 nm from the surface.

In the substrate with a conductive film of the present invention, the conductive film may further contain N at an average concentration of from 1 to 60 at %.

In a case where the conductive film contains N, the conductive film preferably has an average N concentration of at most 10 at % at a portion within at least a film thickness of 5 nm from the surface.

In the substrate with a conductive film of the present invention, the conductive film preferably has a sheet resistance of from 0.1 to 100 Ω/□.

The present invention further provides a substrate with a reflective multilayer film for an EUV mask blank, which comprises the above substrate with a conductive film of the present invention and a reflective multilayer film formed on the opposite side of the substrate from the face on which the conductive film is formed (hereinbelow, referred to as "the substrate with a reflective multilayer film of the present invention" in this Description).

Still further, the present invention provides an EUV mask blank, which comprises the substrate with a reflective multilayer film of the present invention and an absorbing layer formed on the reflective multilayer film (hereinbelow, referred to as "the EUV mask blank of the present invention" in this Description).

The substrate with a conductive film of the present invention has characteristics required as a conductive film, specifically, characteristics with a high surface hardness of the conductive film even with a sheet resistance of at most 100Ω. Accordingly, when the substrate with a conductive film is used for production of an EUV mask blank as fixed to an electrostatic chuck, generation of particles due to rubbing between the electrostatic chuck and the conductive film will be prevented.

Further, the substrate with a conductive film of the present invention is excellent in smoothness on the surface of the conductive film by the crystal structure of the conductive film being amorphous, which also contributes to prevention of generation of particles due to rubbing between the electrostatic chuck and the conductive film.

Further, by this excellent smoothness, adhesion to the electrostatic chuck will be favorable, and the chucking force by the electrostatic chuck will improve.

By favorable adhesion to the electrostatic chuck, thermal conductivity from the substrate with a conductive film to the electrostatic chuck will improve, whereby the substrate cooling performance at the time of the mask patterning process or at the time of exposure will improve.

Further, by the crystal structure being amorphous, the conductive film is less likely to be oxidized, and accordingly, the change with time of the stress in the conductive film will be small. Resultingly, the pattern accuracy is less likely to be deteriorated, and prolongation of life as a mask is expected.

In the substrate with a conductive film of the present invention wherein the conductive film is a gradient composition film, the conductive film has a high surface hardness and the surface of the conductive film is excellent in smoothness since the average B concentration is high on the surface side of the conductive film. Accordingly, when the substrate with a conductive film is used for production of an EUV mask blank as fixed to an electrostatic chuck, generation of particles due to rubbing between the electrostatic chuck and the conductive film will be prevented. Further, as the average B concentration is low on the substrate side of the conductive film, improvement of the adhesion of the conductive film to the substrate is expected.

By using the substrate with a conductive film of the present invention wherein the conductive film contains N, it is possible to prevent deformation of the substrate due to a stress generated in a film deposited by sputtering, specifically, a reflective multilayer film, a capping layer, a buffer layer or an absorbing layer, at the time of producing an EUV mask blank.

EXPLANATION OF REFERENCE NUMERALS

1: Substrate
2: Conductive film
3: Reflective multilayer film
4: Absorbing layer

DETAILED DESCRIPTION OF THE PREFERRED EMBODIMENTS

Now, the present invention will be described in detail with reference to the drawings.

Figure 1:
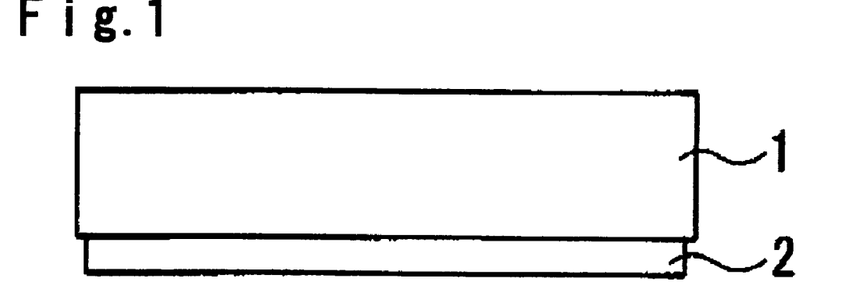
FIG. 1 is a schematic view illustrating a substrate with a conductive film of the present invention.

FIG. 1 is a schematic view illustrating a substrate with a conductive film of the present invention. In FIG. 1, a conductive film 2 is formed on one side of a substrate 1 for film deposition. When a reflective multilayer film and an absorbing layer are deposited on the substrate 1, the substrate 1 is fixed to an electrostatic chuck by means of the conductive film 2. As described hereinafter, the reflective multilayer film and the absorbing layer are deposited on the opposite side of the substrate 1 from the face on which the conductive film 2 is formed (on the film deposition face). That is, the conductive film 2 is formed on the back side of the substrate 1 relative to the film deposition face.

In the substrate with a conductive film of the present invention, the chief material of the conductive film 2 is at least one member selected from the group consisting of Cr, Ti, Zr, Nb, Ni and V. Hereinafter in this Description, "the constituent material of the conductive film 2" means Cr, Ti, Zr, Nb, Ni or V. Cr, Ti, Zr, Nb, Ni and V, which have a high electrical conductivity, are suitable as a constituent material of the conductive film 2.

The conductive layer 2 may contain two or more among Cr, Ti, Zr, Nb, Ni and V as the constituent materials. However, usually any one of Cr, Ti, Zr, Nb, Ni and V is employed as the constituent material.

In the substrate with a conductive film of the present invention, the conductive film 2 contains B (boron) at an average concentration of from 1 to 70 at %. Thus, the conductive film 2 is a film comprising the constituent material of the conductive film 2 and B.

In the conductive film 2, B forms a compound ($CrB_2$, $TiB_2$, $ZrB_2$, $NbB_2$, $NiB_2$ or $VB_2$) with Cr, Ti, Zr, Nb, Ni or V as the constituent material of the conductive film 2.

However, in the substrate with a conductive film of the present invention, all the constituent material (Cr, Ti, Zr, Nb, Ni or V) of the conductive film 2 forms a compound ($CrB_2$, $TiB_2$, $ZrB_2$, $NbB_2$, $NiB_2$ or $VB_2$) with B in some cases, or the conductive film 2 is in such a state that the constituent material (Cr, Ti, Zr, Nb, Ni or V) and a compound ($CrB_2$, $TiB_2$, $ZrB_2$, $NbB_2$, $NiB_2$ or $VB_2$) of the constituent material with B coexist in other cases. In the present invention, preferred is a coexisting state.

In this Description, the concentration of B in the conductive film 2 represents the atomic concentration of B present in the conductive film 2. The concentration of B in the conductive film 2 can be measured, for example, by an X-ray photoelectron spectrometer.

In a case where the conductive film 2 contains B at an average concentration of from 1 to 70 at %, the conductive film 2 as a whole has to contain B at an average concentration of from 1 to 70 at %, and not the entire portion of the conductive film 2 has to contain B at a concentration of from 1 to 70 at %. For example, so long as the conductive film 2 as a whole contains B at an average concentration of from 1 to 70 at %, a portion at a concentration of B less than 1 at % may be present in the conductive film 2, and further, a portion containing no B may be present in the conductive film 2.

Further, the average B concentration in the conductive film 2 can be estimated by sputtering the film from the surface and measuring the profile in the depth direction by an X-ray photoelectron spectrometer.

The conductive film 2 containing B at the above concentration provides the following effects.

By the constituent material of the conductive film 2 (Cr, Ti, Zr, Nb, Ni or V) and B forming a compound ($CrB_2$, $TiB_2$, $ZrB_2$, $NbB_2$, $NiB_2$ or $VB_2$) having a high hardness, the hardness particularly the surface hardness of the conductive film 2 increases. As a result, when the substrate with such a conductive film is used for production of an EUV mask blank as fixed to an electrostatic chuck, generation of particles due to rubbing between the electrostatic chuck and the conductive film 2 is prevented. Further, by the constituent material (Cr, Ti, Zr, Nb, Ni or V) and B forming a compound ($CrB_2$, $TiB_2$, $ZrB_2$, $NbB_2$, $NiB_2$ or $VB_2$), the crystal structure of the conductive film 2 becomes amorphous. By the crystal structure being amorphous, smoothness on the surface of the conductive film 2 increases. This also contributes to prevention of generation of particles due to rubbing between the electrostatic chuck and the conductive film.

By the crystal structure of the conductive film 2 being amorphous, the following effects are further expected.

By the smoothness on the surface of the conductive film 2 becoming high, favorable adhesion to the electrostatic chuck will be obtained. As a result, the chucking force by the electrostatic chuck will also improve.

Further, the adhesion to the electrostatic chuck being favorable, thermal conductivity from the conductive film 2 to the electrostatic chuck and thus the thermal conductivity from the substrate 1 to the electrostatic chuck will improve. Accordingly, substrate cooling performance at the time of the mask patterning process or at the time of exposure will improve.

Further, the crystal structure being amorphous, the conductive film 2 is less likely to be oxidized, and accordingly, the change with time of the stress in the conductive film 2 tends to be small. As a result, the pattern accuracy is less likely to be deteriorated, and prolongation of the life as a mask can be expected.

In a case where the average B concentration in the conductive film 2 is less than 1 at % or exceeds 70 at %, the above effects i.e. the effect of increasing the hardness of the conductive film 2 (particularly the surface hardness of the conductive film 2) and the effect of increasing the smoothness on the surface of the conductive film 2 cannot sufficiently be obtained.

The average B concentration in the conductive film 2 is more preferably from 30 to 70 at %, furthermore preferably from 50 to 68 at %.

The conductive film 2 is preferably constituted, among Cr, Ti, Zr, Nb, Ni and V, by Cr, since it has a low electrical conductivity and is thereby suitable to make the sheet resistance of the conductive film 2 be at most 100 Ω/□, particularly at most 50 Ω/□, it is inexpensive, it is excellent in adhesion to the substrate 1, and knowledge regarding film deposition is considerably accumulated since it is widely used as a mask material. Further, although the resistance tends to increase by addition of B to the conductive film, in the case of use as an electrostatic chuck for EUV, it is more important to prevent generation of particles at the time of film deposition than to decrease the resistance in view of precision.

As described above, so long as the conductive film 2 as a whole contains B at an average concentration of from 1 to 70 at %, a portion at a B concentration less than 1 at % may be present in the conductive film 2, and a portion containing no B may be present. That is, B may be unevenly present at a specific portion in the conductive film 2. For example, B may be unevenly present on the substrate 1 side of the conductive film 2. In such a case, the average B concentration is high on the substrate side of the conductive film 2, and the average B concentration is low on the surface side. Otherwise, on the contrary, B may be unevenly present on the surface side of the conductive film 2. In such a case, the average B concentration is low on the substrate 1 side of the conductive film 2, and the average B concentration is high on the surface side. Here, the surface of the conductive film 2 represents the surface of the conductive film 2 in FIG. 1, i.e. a face opposite to the face (the face on the substrate 1 side) to be in contact with the substrate 1 of the conductive film 2 and to be in contact with an electrostatic chuck when the substrate with a conductive film is fixed to an electrostatic chuck.

However, in the substrate with a conductive film of the present invention, in order that the effects obtainable by incorporating B in the conductive film 2, i.e. the effect of increasing the surface hardness of the conductive film 2 and the effect of increasing the smoothness on the surface of the conductive film 2, are more effectively exhibited, the conductive film 2 is preferably a gradient composition film wherein the concentration of B in the conductive film 2 changes along the thickness direction of the conductive film 2 so that the average B concentration is low on the substrate 1 side and the average B concentration is high on the surface side (hereinbelow, referred to as "the gradient composition film" in this Description).

In this Description, "the gradient composition film" not only includes a conductive film having such a structure that the B concentration in the conductive film 2 continuously changes along the thickness direction of the conductive film 2 so that the average B concentration is low on the substrate 1 side and the average B concentration is high on the surface side (hereinbelow, sometimes referred to as "the narrowly-defined gradient composition film") but widely includes a conductive film having a structure such that B is unevenly present on the surface side. Accordingly, the conductive film may be a conductive film having a structure such that a plurality of layers differing in the average B concentration are stacked (hereinbelow, sometimes referred to as "the stacked conductive film"). However, in such a case, layers are stacked so that the layer on the substrate side is a layer having a low average B concentration and the layer on the surface side is a layer having a high average B concentration. In the stacked conductive film, the number of layers is not particularly limited. Accordingly, the stacked conductive film may comprise two layers or more.

Further, so long as the conductive film 2 as a whole contains B at an average concentration of from 1 to 70 at %, the gradient composition film may contain a portion containing no B on the substrate 1 side. In such a case, the narrowly-defined gradient composition film has the following structure.

A portion in the vicinity of the substrate 1 in the conductive film 2 contains no B.

A portion other than a portion in the vicinity of the substrate 1 in the conductive film 2 contains B.

The B concentration in the conductive film 2 continuously changes along the thickness direction of the conductive film 2.

The conductive film 2 as a whole contains B at an average concentration of from 1 to 70 at %.

On the other hand, in a case where the conductive film 2 has a stacked structure (two layers), it has the following structure.

The layer on the substrate 1 side of the conductive film 2 contains no B.

The layer on the surface side of the conductive film 2 contains B.

The conductive film 2 as a whole contains B at an average concentration of from 1 to 70 at %.

Further, in a case where the conductive film 2 has a stacked structure comprising at least three layers, it has the following structure.

The outermost layer on the substrate 1 side in the conductive film 2 contains no B.

Layers other than the outermost layer on the substrate 1 side of the conductive film 2 contain B.

Layers containing B are stacked so that the average B concentration increases from the substrate 1 side toward the surface side.

The conductive film 2 as a whole contains B at an average concentration of from 1 to 70 at %.

As described above, in the substrate with a conductive film of the present invention, by the conductive film 2 containing B, the effect of increasing the hardness (particularly, surface hardness) of the conductive film 2 and the effect of increasing the smoothness on the surface of the conductive film 2 are exhibited. In the gradient composition film, since the average B concentration is high on the surface side of the conductive film 2, these effects will more effectively be exhibited. Further, since the average B concentration is low on the substrate side of the conductive film 2 and the Cr concentration is high, adhesion to the substrate 1 is also favorable.

In the gradient composition film, the average B concentration is preferably at most 15 at % at a portion within a film thickness of 5 nm from the face on the substrate 1 side (hereinbelow, in this Description, referred to as "the portion in the vicinity of the substrate"). Excellent adhesion to the substrate 1 is achieved when the average B concentration is at most 15 at % at the portion in the vicinity of the substrate. The average B concentration at the portion in the vicinity of the substrate is more preferably at most 10 at %, furthermore preferably at most 5 at %, and particularly preferably the portion in the vicinity of the substrate contains substantially no B.

Further, where the total film thickness of the conductive film 2 is L (nm), the above portion in the vicinity of the substrate preferably corresponds to a portion of 0.05 L from the face on the substrate 1 side.

In the gradient composition film, the average B concentration is preferably from 1 to 70 at % at a portion within at least a film thickness of 5 nm from the surface (hereinbelow, in this Description, referred to as "the portion in the vicinity of the surface"). When the average B concentration is from 1 to 70 at % at the portion in the vicinity of the surface, the conductive film 2 will be excellent in surface hardness and the surface of the conductive film 2 will be excellent in smoothness. The average B concentration at the portion in the vicinity of the surface is more preferably from 10 to 70 at %, furthermore preferably from 30 to 68 at %.

In the gradient composition film, the portion in the vicinity of the surface corresponds preferably to a portion within at least a film thickness of 50 nm from the surface, more preferably a portion within at least a film thickness of 90 nm.

Further, where the total film thickness of the conductive film 2 is L (nm), the above portion in the vicinity of the surface corresponds to preferably a portion within at least 0.05 L from the surface, more preferably a portion within at least 0.1 L from the surface.

Further, the oxygen concentration in the conductive film of the present invention is preferably at most 5 at %. If the content of the oxygen is too high, there is a possibility that abnormal discharge is caused when a reflective multilayer film or an absorbing layer is deposited. Further, on the surface of the conductive film, the oxygen concentration increases by spontaneous oxidation at a portion at a level of 5 nm from the film surface to such an extent that the electrostatic chuck will not be influenced. Accordingly, the oxygen concentration in this application is a value measured excluding a portion at a level of 5 nm from the film surface.

In the substrate with a conductive film of the present invention, the film thickness L of the conductive film 2 is preferably from 10 to 500 nm. If the film thickness L of the conductive film 2 is less than 10 nm, the chucking force may be insufficient when the substrate with a conductive film is fixed to the electrostatic chuck due to a small thickness of the conductive film 2. Further, the substrate 1 may undergo dielectric breakdown when the substrate with a conductive film is fixed to the electrostatic chuck and a high voltage is applied.

If the film thickness L of the conductive film 2 exceeds 500 nm, such will no more contribute to the improvement in the chucking force, but increases the time required for the formation of the conductive film 2 and increases the cost required for formation of the conductive film 2. Further, the probability of film peeling increases since the film thickness of the conductive film 2 is greater than needed.

The film thickness of the conductive film 2 is more preferably from 50 to 400 nm, furthermore preferably from 50 to 200 nm, particularly preferably from 50 to 100 nm.

The conductive film 2 preferably has a surface hardness of at least 12 GPa. When the surface hardness of the conductive film 2 is at least 12 GPa, the conductive film 2 is excellent in surface hardness, and is excellent in the effect of preventing generation of particles due to rubbing between the electrostatic chuck and the conductive film when the substrate with a conductive film is used for production of an EUV mask blank as fixed to the electrostatic chuck. Here, the method of measuring the surface hardness of the conductive film 2 is not particularly limited, and a known method, specifically, for example, Vickers hardness test, Rockwell hardness test, Brinell hardness test or nanoindentation test may be used. Among them, nanoindentation test is widely used when the surface hardness of a thin film is measured. In Examples described hereinafter, the surface hardness of the conductive film 2 was measured by nanoindentation test.

The surface hardness of the conductive film 2 is more preferably at least 20 GPa.

The surface of the conductive film 2 is preferably excellent in smoothness. Specifically, the smoothness on the surface of the conductive film 2 is preferably at most 0.5 nm by Rms (root-mean-square roughness). When the smoothness on the surface of the conductive film 2 is at most 0.5 nm by Rms, an excellent effect of preventing generation of particles due to rubbing between the electrostatic chuck and the conductive film 2 will be obtained when the substrate with a conductive film is used for production of an EUV mask blank as fixed to the electrostatic chuck.

In the substrate with a conductive film of the present invention, the stress (specifically, compressive stress) generated in the conductive film 2 can be increased by incorporating N in the conductive film 2.

In the substrate with a conductive film of the present invention, by the constituent material of the conductive film 2 (Cr, Ti, Zr, Nb, Ni or V) and B forming a compound ($CrB_2$, $TiB_2$, $ZrB_2$, $NbB_2$, $NiB_2$ or $VB_2$), the crystal structure becomes amorphous. In a case where the crystal structure becomes amorphous, the stress generated in the conductive film 2 tends to decrease. Since a decrease in stress generated in the conductive film 2 improves the adhesion of the conductive film 2 to the substrate 1, it is usually preferred. However, in the substrate with a conductive film of the present invention, it is preferred to increase the stress generated in the conductive film 2 in some cases as described below.

When N is incorporated in the conductive film 2 of which the crystal structure becomes amorphous by the constituent material of the conductive film 2 (Cr, Ti, Zr, Nb, Ni or V) and B forming a compound ($CrB_2$, $TiB_2$, $ZrB_2$, $NbB_2$, $NiB_2$ or $VB_2$), a crystalline phase (BN phase, $CrN_2$ phase (in a case where the constituent material of the conductive film 2 is Cr)) is generated in the conductive film 2, which increases the volume of the conductive film 2, whereby the compressive stress in the conductive film 2 is increased.

At the time of producing an EUV mask blank, a reflective multilayer film is deposited on the substrate. On the reflective multilayer film, an absorbing layer is deposited. A buffer layer may be deposited between the reflective multilayer film and the absorbing layer in some cases. For film deposition of these layers, sputtering such as magnetron sputtering or ion beam sputtering is usually employed. In a film deposited by sputtering, a stress (usually a compressive stress) is generated in some cases.

For example, in a case where a Si/Mo reflective multilayer film is deposited by alternately depositing from 40 to 50 layers of a Si film (low refractive index layer, film thickness: 4.5 nm) and a Mo film (high refractive index layer, film thickness: 2.3 nm) as a reflective multilayer film on a substrate, a compressive stress of from 400 to 500 MPa is generated in the reflective multilayer film after film deposition.

At the time of film deposition by sputtering, the substrate is fixed by an electrostatic chuck. Even when a stress is generated in a deposited film, the substrate will not be deformed by such a stress in a state where it is fixed to the electrostatic chuck. However, when the substrate is removed from the electrostatic chuck, the substrate may be deformed by the stress generated in the film. As described above, if a great compressive stress of from 400 to 500 MPa is generated in the reflective multilayer film, even a quartz glass substrate having high rigidity will be deformed to a certain extent. For example, in a case where a compressive stress of from 400 to 500 MPa generated in the reflective multilayer film after film deposition is applied to a $SiO_2$—$TiO_2$ glass substrate (outer dimensions of 6 inches (152.4 mm) square, thickness 6.3 mm, coefficient of thermal expansion $0.2 \times 10^{-7}/°$ C., Young's modulus 67 GPa, specific rigidity $3.1 \times 10^7$ $m^2/s^2$) which is commonly used as a substrate for an EUV mask blank, the substrate will be deformed so as to be warped in a convex shape having a height of about 2 μm toward the deposition face.

In an EUV mask blank, the allowable limit of flatness is 100 nm or below from end to end of the mask blank. If the substrate is deformed so as to be warped in a convex shape having a height of about 2 μm toward the deposition face (multilayer film face) side, the flatness of the substrate is at least about 2 μm, and accordingly, the above allowable limit cannot be satisfied.

When a compressive stress generated in the conductive film 2 formed on the opposite side of the substrate 1 from the deposition face is increased, it is possible to prevent the substrate 1 from being deformed by a stress generated in a film deposited by sputtering on the deposition face of the substrate 1. That is, a stress generated in a film deposited by sputtering on the deposition face of the substrate 1, i.e. the reflective multilayer film and the absorbing layer, and the buffer layer optionally formed, is usually a compressive stress. Accordingly, when the compressive stress generated in the conductive film 2 formed on the back side of the substrate 1 is increased, it is possible to cancel the compressive stress generated in the reflective multilayer film or the like by the compressive stress generated in the conductive film 2, and reduction in the amount of deformation of the substrate 1 can be expected.

In the substrate with a conductive film of the present invention, the conductive film 2 may contain N at an average concentration of from 1 to 60 at %. The N concentration in the conductive film 2 means the atomic concentration of N present in the conductive film 2. The average N concentration in the conductive film 2 can be estimated by sputtering the film from the surface and measuring the profile in the depth direction by an X-ray photoelectron spectrometer. If the average N concentration in the conductive film 2 is less than 1 at %, the compressive stress generated in the conductive film 2 cannot sufficiently be high.

When the average N concentration in the conductive film 2 is increased, the compressive stress generated in the conductive film 2 increases correspondingly. However, if the average N concentration in the conductive film 2 is high, the hardness of the conductive film decreases correspondingly. If the average N concentration in the conductive film 2 exceeds 60 at %, the hardness (particularly the surface hardness) of the conductive film 2 tends to be insufficient.

On the other hand, when the conductive film 2 contains N at an average concentration of from 1 to 60 at %, the compressive stress generated in the conductive film 2 cancels the compressive stress generated in the reflective multilayer film or the absorbing layer, whereby the amount of deformation of the substrate 1 is reduced, and it is even possible that the amount of deformation of the substrate 1 is zero. For example, in a conductive film having an average B concentration of from 30 to 66 at %, an average N concentration of from 5 to 20 at % and a film thickness of from 100 to 150 nm, a compressive stress of from 200 to 400 GPa is generated. As described above, a compressive stress of from 400 to 500 MPa is generated in some cases in the reflective multilayer film deposited on the substrate. It is considered that when a compressive stress of from 200 to 400 GPa is generated in the conductive film, the compressive stress generated in the reflective multilayer film can be cancelled and the amount of deformation of the substrate 1 can be made zero.

The conductive film 2 containing N at an average concentration of from 1 to 60 at % means the conductive film 2 as a whole contains N at an average concentration of from 1 to 60 at %, and not all the portion of the conductive film 2 has to contain N at a concentration of from 1 to 60 at %. For example, so long as the conductive film 2 as a whole contains N at an average concentration of from 1 to 60 at %, a portion at a N concentration less than 1 at % may be present in the conductive film 2, and a portion containing no N may be present.

As described above, when the conductive film 2 contains N, the compressive stress generated in the conductive film 2 tends to be high, but on the contrary, the hardness (particularly the surface hardness) of the conductive film 2 tends to decrease. Accordingly, at a portion in the vicinity of the surface (a portion within at least a film thickness of 5 nm from the surface) of the conductive film 2, the average N concentration is preferably at most 10 at %. By the average N concentration at a portion in the vicinity of the surface of the conductive film 2 being at most 10 at %, the decrease in surface hardness of the conductive film 2 can be reduced. The portion in the vicinity of the surface of the conductive film 2 preferably contains substantially no N.

In the substrate with a conductive film of the present invention, the conductive film 2 can be formed by a known film deposition method such as sputtering such as magnetron sputtering or ion beam sputtering, a CVD method, a vacuum deposition method, an electrolytic plating method. For example, in the case of forming a conductive film comprising Cr as the constituent material and containing B, the conductive film is deposited by magnetron sputtering using a $CrB_2$ target as the target and an Ar gas as the sputtering gas. Further, in the case of forming a conductive film comprising Cr as the constituent material and containing B and N, the conductive film can be deposited by means of magnetron sputtering using a $CrB_2$ target as the target and an Ar gas and a $N_2$ gas as the sputtering gas. Further, in the case of forming a conductive film having a stacked structure (two-layer structure, the constituent material is Cr, the lower layer contains no B, and the upper layer contains B), the lower layer is deposited by magnetron sputtering by using a Cr target as the target and an Ar gas as the sputtering gas, and then the upper layer is deposited by magnetron sputtering using a $CrB_2$ target as the target and an Ar gas as the sputtering gas. Further, in the case of forming a narrowly-defined gradient composition film, the conductive film is deposited by means of magnetron sputtering using a Cr target and a $CrB_2$ target as the target and an Ar gas as the sputtering gas, while adjusting the electric power of the Cr target and the $CrB_2$ target applied, etc.

In the substrate with a conductive film of the present invention, the shape and the range of the conductive film 2 formed on the substrate 1 are not particularly limited. However, as disclosed in JP-A-2005-210093, it is preferred not to form the conductive film at the peripheral portion of the substrate, so as to suppress film peeling of the conductive.

At the time of forming a pattern on an EUV mask blank i.e. at the time of the mask patterning process, in order to form a fine pattern, pattern formation is carried out usually by electron beam lithography.

For pattern formation by electron beam lithography, first, the surface of an absorbing layer of an EUV mask blank is coated with a resist for electron beam lithography, followed by baking treatment such as baking treatment at 200° C. Then, the surface of the resist is irradiated with electron beams by an electron beam lithography apparatus, followed by development to form a resist pattern. The mask having a pattern formed thereon in the above procedure is subjected to exposure process employing EUV light. Such operations are carried out in a state where the EUV mask blank (or the mask having a pattern formed thereon) is fixed to an electrostatic chuck.

At the time of the above pattern formation or exposure by EUV light, the temperature of the substrate will increase. The temperature increase of the substrate may adversely affect the pattern accuracy and is unfavorable. Accordingly, an investigation has been made on cooling of the substrate during the pattern formation. Various methods could be proposed as the method to cool the substrate. For example, there are a method to cool a substrate by passing a liquid or a gas in an electrostatic chuck, and a method to cool the substrate by passing a gas in a gap between a pin chuck and the substrate. In these methods, it is preferred that the adhesion between the conductive film 2 and the electrostatic chuck is high and that the thermal conductivity is high at a sight where they are in contact with each other, in view of the cooling efficiency of the substrate.

In the substrate with a conductive film of the present invention, the substrate 1 for film deposition is required to satisfy properties as a substrate for an EUV mask blank. Accordingly, the substrate 1 is preferably one having a low coefficient of thermal expansion (preferably $0\pm1.0\times10^{-7}/°$ C., more preferably $0\pm0.3\times10^{-7}/°$ C., furthermore preferably $0\pm0.2\times10^{-7}/°$ C., still more preferably $0\pm0.1\times10^{-7}/°$ C., particularly preferably $0\pm0.05\times10^{-7}/°$ C.) and being excellent in smoothness, flatness and resistance to a cleaning liquid to be used e.g. for a mask blank or a photomask after formation of a pattern. As the substrate 1, specifically, glass having a low coefficient of thermal expansion, such as a $SiO_2$—$TiO_2$ glass may be used, but the glass is not limited thereto, and a substrate made of crystallized glass with a β quartz solid solution precipitated therein, quartz glass, silicon, metal or the like may also be used.

The substrate 1 preferably has a smooth surface with Rms of at most 0.15 nm and a flatness of at most 100 nm, with a view to obtaining a high reflectance and printing precision in a photomask after pattern formation.

The dimensions, the thickness and the like of the substrate 1 are properly determined according to the designed values of a mask or the like. In Examples described hereinafter, a $SiO_2$—$TiO_2$ glass having outer dimensions of 6 inch (152.4 mm) square and a thickness of 0.25 inch (6.3 mm) was used.

Figure 2:
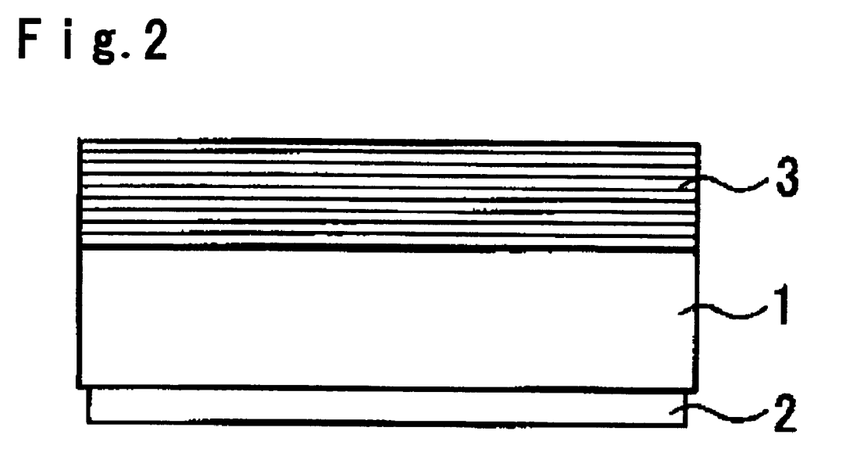
FIG. 2 is a schematic view illustrating a substrate with a reflective multilayer film of the present invention.

Now, the substrate with a reflective multilayer film of the present invention will be described. FIG. 2 is a schematic view illustrating a substrate with a reflective multilayer film of the present invention. In FIG. 2, a reflective multilayer film 3 is formed on the opposite side of a substrate 1 from a face on which a conductive film 2 is formed. Here, the substrate 1 and the conductive film 2 are ones shown in FIG. 1 (the substrate with a conductive film of the present invention). The substrate with a reflective multilayer film of the present invention can be obtained by fixing the substrate with a conductive film of the present invention to an electrostatic chuck and then depositing a reflective multilayer film 3 on the deposition face of the substrate 1 by sputtering such as magnetron sputtering or ion beam sputtering.

The reflective multilayer film 3 deposited on the film deposition face of the substrate 1 is not particularly limited so long as it has properties desired as a reflective multilayer film for an EUV mask blank. The property that is particularly required for the reflective multilayer film 3 is that it is a film having a high EUV light reflectance. Specifically, when a ray in the wavelength range of the EUV light is applied to the surface of the reflective multilayer film, the maximum reflectance to a light having a wavelength in the vicinity of 13.5 nm is preferably at least 60%, more preferably at least 65%.

The reflective multilayer film 3 that satisfies the above properties may, for example, be a Si/Mo reflective multilayer film having Si films and Mo films alternately stacked, a Be/Mo reflective multilayer film having Be films and Mo films alternately stacked, a Si compound/Mo compound reflective multilayer film having Si compound films and Mo compound films alternately stacked, a Si/Mo/Ru reflective multilayer film having a Si film, a Mo film and a Ru film stacked in this order, or a Si/Ru/Mo/Ru reflective multilayer film having a Si film, a Ru film, a Mo film and a Ru film stacked in this order.

The operation of depositing the reflective multilayer film 3 on the deposition face of the substrate 1 may be an operation commonly carried out to deposit a reflective multilayer film by means of sputtering. For example, in the case of forming a Si/Mo reflective multilayer film by ion beam sputtering, it is preferred to deposit a Si film so as to have a thickness of 4.5 nm, using a Si target as the target and an Ar gas (having a gas pressure of $1.3\times10^{-2}$ Pa to $2.7\times10^{-2}$ Pa) as the sputtering gas, with an ion acceleration voltage of from 300 to 1,500 V at a film deposition rate of from 0.03 to 0.30 nm/sec, and then to form a Mo film so as to have a thickness of 0.3 nm, using a Mo target as the target and an Ar gas (having a gas pressure of from $1.3\times10^{-2}$ Pa to $2.7\times10^{-2}$ Pa) as the sputtering gas with an ion acceleration voltage of from 300 to 1,500 V at a film deposition rate of from 0.03 to 0.30 nm/sec. By stacking Si films and Mo films in 40 to 50 cycles, each of the cycles comprising the above steps, the Si/Mo reflective multilayer film is deposited. When the reflective multilayer film 3 is deposited, it is preferred to carry out film deposition while rotating the substrate 1 by a rotor to obtain uniform films.

In the substrate with a reflective multilayer film of the present invention, the outermost layer of the reflective multilayer film 3 is preferably a layer made of a material which is hardly oxidized, so as to prevent the surface of the reflective multilayer film 3 being oxidized. The layer made of a material which is hardly oxidized, serves as a capping layer for the reflective multilayer film 3. As a specific example of the layer made of a material hardly oxidized, which serves as the capping layer, a Si layer may be mentioned. In a case where the reflective multilayer film is a Si/Mo film, the outermost layer can serve as the capping layer, if it is a Si layer. In such a case, the film thickness of the capping layer is preferably 11.0±1.0 nm.

Since the substrate with a reflective multilayer film of the present invention employs the substrate with a conductive film of the present invention, at the time of depositing the reflective multilayer film by fixing the substrate with a conductive film to an electrostatic chuck, generation of particles due to rubbing between the electrostatic chuck and the conductive film is prevented. Accordingly, the substrate with a reflective multilayer film of the present invention is an excellent substrate with a reflective multilayer film with few surface defects by particles.

Figure 3:
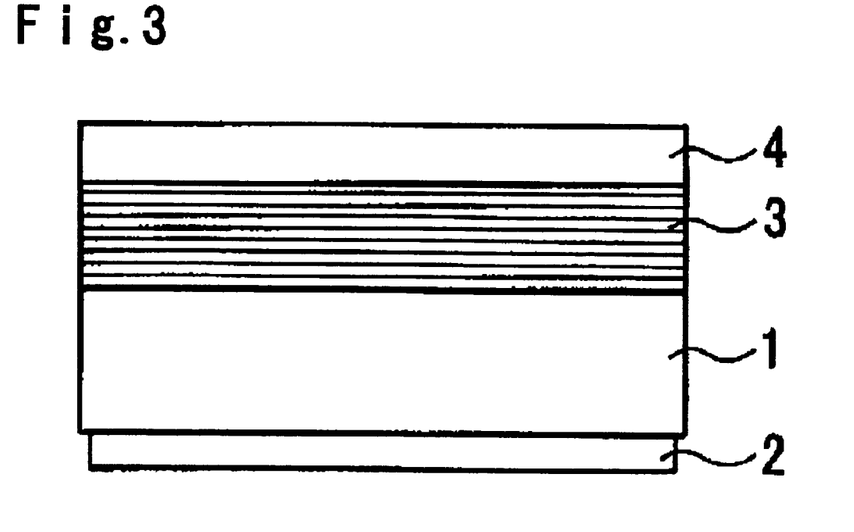
FIG. 3 is a schematic view illustrating an EUV mask blank of the present invention.

Now, the EUV mask blank of the present invention will be described. FIG. 3 is a schematic view illustrating an EUV mask blank of the present invention. In FIG. 3, an absorbing layer 4 is formed on a reflective multilayer film 3. Here, a substrate 1, a conductive film 2 and the reflective multilayer film 3 are ones shown in FIG. 2 (the substrate with a reflective multilayer film of the present invention). The EUV mask blank of the present invention is obtained by fixing the substrate with a reflective multilayer film of the present invention to an electrostatic chuck and then depositing an absorbing layer 4 on the reflective multilayer film 3 by means of sputtering such as magnetron sputtering or ion beam sputtering.

In the EUV mask blank of the present invention, as a constituent material of the absorbing layer 4 deposited on the reflective multilayer film 3, a material having a high absorption coefficient to EUV light, specifically, Cr, Ta or a nitride thereof may, for example, be mentioned. Particularly, TaN is preferred, which is easily be amorphous and has a smooth surface texture. The thickness of the absorbing layer 4 is preferably from 50 to 100 nm. The method for depositing the absorbing layer 4 is not particularly limited so long as it is sputtering, and either magnetron sputtering or ion beam sputtering is applicable.

In the case of depositing a TaN layer as the absorbing layer by means of ion beam sputtering, it is preferred to deposit the layer so as to have a thickness of from 50 to 100 nm, using a Ta target as the target and a $N_2$ gas (having a gas pressure of from $1.3 \times 10^{-2}$ Pa to $2.7 \times 10^{-2}$ Pa) as the sputtering gas at a voltage of from 300 to 1,500 V at a film deposition rate of from 0.01 to 0.1 nm/sec.

When the absorbing layer 4 is deposited by means of sputtering, it is preferred to carry out film deposition while rotating the substrate 1 by a rotor to obtain a uniform film.

In the EUV mask blank of the present invention, a buffer layer may be present between the reflective multilayer film 3 and the absorbing layer 4.

As a material constituting the buffer layer, Cr, Al, Ru, Ta or a nitride thereof, or $SiO_2$, $Si_3N_4$ or $Al_2O_3$ may, for example, be mentioned. The buffer layer preferably has a thickness of from 10 to 60 nm.

Since the EUV mask blank of the present invention employs the substrate with a reflective multilayer film of the present invention, the number of surface defects by particles is very small on the reflective multilayer film. Further, when the substrate with a reflective multilayer film is fixed to an electrostatic chuck to deposit the absorbing layer, generation of particles due to rubbing between the electrostatic chuck and the conductive film is prevented. Thus, the absorbing layer also has very small number of surface defects by particles.

Further, it is possible to form an EUV mask with a very small number of surface defects by patterning the above EUV mask blank. By reducing the defects, exposure with reduced defects can be carried out, and excellent productivity of semiconductor is also achieved.

Now, the present invention will be described in further detail with reference to Examples.

EXAMPLE 1

Formation of Conductive Film

In this Example, as a substrate 1 (see FIG. 1) for film deposition, a $SiO_2$—$TiO_2$ glass substrate (outer dimensions of 6 inch (152.4 mm) square, thickness 6.3 mm) is used. This glass substrate has a coefficient of thermal expansion of $0.2 \times 10^{-7}/°$ C. and a Young's modulus of 67 GPa. This glass substrate is polished so as to have a smooth surface with Rms of 0.15 nm or below and a flatness of 100 nm or below.

By magnetron sputtering, a conductive film 2 (constituent material: Cr, containing B) is deposited on the surface of the substrate 1. Specifically, magnetron sputtering is carried out by using a $CrB_2$ target in an argon gas atmosphere to form a conductive film 2 having a thickness of 100 nm. The deposition conditions for the conductive film 2 are as follows.

Target: a $CrB_2$ target
Sputtering gas: Ar gas (gas pressure: 0.3 Pa)
Electric power applied: 250 W
Deposition rate: 0.45 nm/sec The average B concentration in the conductive film 2 is confirmed to be 66 at % as measured by an X-ray photoelectron spectrometer. The sheet resistance of the conductive film 2 is confirmed to be 20 Ω/□ as measured by a four-point probe measuring apparatus. The smoothness on the surface of the conductive film 2 is confirmed to be 0.5 nm or below as measured by AFM (atomic force microscope).

(Evaluation of Surface Hardness)

The surface hardness of the conductive film 2 deposited by the above operations is measured by nanoindentation test. Specifically, a triangular pyramid (Berkovich) indenter comprising a diamond chip is pressed into the surface of the conductive film 2, and from the load P and the projected area A below the indenter, the surface hardness H (H=P/A) is calculated. As a result, the surface hardness H is confirmed to be 22.5 GPa.

(Deposition of Reflective Multilayer Film)

Then, a reflective multilayer film (Si/Mo reflective multilayer film) is deposited on the opposite side (deposition face) of the substrate from the conductive film 2 by means of ion beam sputtering. Specifically, a cycle comprising alternately depositing a Si film and a Mo film is repeated 40 times to form a Si/Mo reflective multilayer film having a total film thickness of 272 nm ((4.5+2.3)×40). Finally, a Si layer is deposited so as to have a film thickness of 11.0 nm as a capping layer.

The deposition conditions for the Si films and the Mo films are as follows.

(Deposition Conditions for the Si Films)
Target: Si target (doped with boron)
Sputtering gas: Ar gas (gas pressure 0.02 Pa)
Voltage: 700 V
Deposition rate: 0.077 nm/sec
Film thickness: 4.5 nm (Deposition Conditions for Mo Films)
Target: Mo target
Sputtering gas: Ar gas (gas pressure 0.02 Pa)
Voltage: 700 V
Deposition rate: 0.064 nm/sec
Film thickness: 2.3 nm (Evaluation of Surface Defects)

The number of particles on the reflective multilayer film deposited by the above operations is measured by using a defect tester. As a result, the number of particles is 1.5 particles/cm$^2$, and it is confirmed that substantially no particles are generated at the time of depositing the reflective multilayer film. Here, with respect to the number of particles, particles having sizes of 0.15 μm or larger are counted.

Then, on the reflective multilayer film (Si/Mo reflective multilayer film) deposited by the above operations, a TaN layer as an absorbing layer to EUV light is deposited by means of ion beam sputtering to obtain an EUV mask blank. The deposition conditions are as follows.

(Deposition Conditions for TaN Layer)
  Target: Ta target
  Sputtering gas: $N_2$ gas (gas pressure 0.02 Pa)
  Voltage: 700 V
  Deposition rate: 0.015 nm/sec
  Film thickness: 70 nm The number of particles on the surface of the absorbing layer of the EUV mask blank obtained by the above operations is 2.0 particles/cm$^2$ as measured in the same manner as above, and the EUV mask blank is confirmed to be an EUV mask blank having a small number of surface defects by particles.

EXAMPLE 2

This Example is the same as Example 1 except that the conductive film formed on the surface of the glass substrate is a conductive film comprising Cr as the constituent material and containing B and N. The deposition conditions for the conductive film 2 are as follows.

Target: $CrB_2$ target
  Sputtering gas: Ar gas, $N_2$ gas (Ar: 99.8 vol %, $N_2$: 0.2 vol %, gas pressure: 0.3 Pa)
  Electric power applied: 250 W
  Deposition rate: 0.4 nm/sec
  Film thickness: 100 nm The average B concentration and the average N concentration in the conductive film 2 are confirmed to be 45 at % and 10 at %, respectively, as measured in the same manner as in Example 1. The sheet resistance of the conductive film 2 is measured, whereupon it is confirmed to be 80 Ω/□. The surface hardness of the conductive film 2 is measured, whereupon it is confirmed to be 13.0 GPa. Further, the amount of deformation (the amount of warp) of the substrate is measured by using a flatness measuring apparatus to determine the compressive stress generated in the conductive film. As a result, the compressive stress generated in the conductive film 2 is confirmed to be 400 MPa.

Further, in the same manner as in Example 1, a reflective multilayer film (Si/Mo reflective multilayer film) is deposited on the deposition face of the substrate 1, and the number of particles on the reflective multilayer film is measured by using a defect tester, whereupon the number of particles is 1.0 particle/cm$^2$, and it is confirmed that substantially no particles are generated at the time of depositing the reflective multilayer film.

Then, in the same manner as in Example 1, an absorbing layer (TaN layer) is deposited on the reflective multilayer film deposited by the above operations, to obtain an EUV mask blank. The number of particles on the surface of the absorbing layer of the obtained EUV mask blank is 1.5 particles/cm$^2$ as measured in the same manner as above, and the EUV mask blank is confirmed to be an EUV mask blank having a small number of surface defects by particles.

EXAMPLE 3

This Example is the same as in Example 1 except that the conductive film formed on the glass substrate is a conductive film having a stacked structure (two layers) (the constituent material is Cr, a layer (lower layer) on the substrate side contains no B, and a layer (upper layer) on the surface side contains B). The deposition conditions for the lower and upper layers are as follows.

(Deposition Conditions for Lower Layer)
  Target: Cr target
  Sputtering gas: Ar gas (gas pressure: 0.3 Pa)
  Electric power applied: 300 W
  Deposition rate: 0.5 nm/sec
  Film thickness: 50 nm (Deposition Conditions for Upper Layer)
  Target: $CrB_2$ target
  Sputtering gas: Ar gas (gas pressure: 0.3 Pa)
  Electric power applied: 250 W
  Deposition rate: 0.45 nm/sec
  Film thickness: 50 nm The average B concentrations in the upper layer and the lower layer are measured, whereupon they are confirmed to be 66 at % in the upper layer and 0 at % in the lower layer. The sheet resistance of the conductive film 2 is measured, whereupon it is confirmed to be 20 Ω/□. The surface hardness of the conductive film 2 is measured, whereupon it is confirmed to be 22.0 GPa.

Further, in the same manner as in Example 1, a reflective multilayer film (Si/Mo reflective multilayer film) is formed on the deposition face of the substrate 1, and the number of particles on the reflective multilayer film is measured by using a defect tester, whereupon the number of particles is 0.5 particle/cm$^2$, and it is confirmed that substantially no particles are generated at the time of depositing the reflective multilayer film.

Then, in the same manner as in Example 1, an absorbing layer (TaN layer) is deposited on the reflective multilayer film deposited by the above operations to obtain an EUV mask blank. The number of particles on the surface of the absorbing layer of the obtained EUV mask blank is 1.0 particle/cm$^2$ as measured in the same manner as above, and the EUV mask blank is confirmed to be an EUV mask blank having a small number of surface defects by particles.

EXAMPLE 4

This Example is the same as Example 1 except that the conductive film 2 formed on the glass substrate is a narrowly-defined gradient composition film (a conductive film comprising Cr as the constituent material and having such a structure that the B concentration in the conductive film 2 continuously changes along the thickness direction of the conductive film 2 so that a portion on the glass substrate side contains no B and a portion on the surface side has a high average B concentration). The deposition conditions for the conductive film are as follows. Further, the B concentration in the conductive film 2 is changed by adjusting the electric power of a Cr target and a B target applied.

Target: Cr target, $CrB_2$ target
  Sputtering gas: Ar gas (gas pressure: 0.3 Pa)
  Electric power applied: 100 to 300 W (Cr target), 0 to 300 W ($CrB_2$ target)
  Deposition rate: 0.4 nm/sec
  Film thickness: 100 nm The average B concentration in the conductive film 2 is 33 at %. The average B concentration at a portion in the vicinity of the surface (a portion within 5 nm from the surface) of the conductive film 2 is measured, whereupon it is confirmed to be 66 at %. The average B concentration at a portion in the vicinity of the substrate (a portion within 5 nm from the face of the substrate) of the substrate 2 is measured, whereupon it is confirmed to be 0 at %. The sheet resistance of the conductive film 2 is measured, whereupon it is confirmed to be 22 Ω/□. The surface hardness of the conductive film 2 is measured, whereupon it is confirmed to be 22.0 GPa.

Further, in the same manner as in Example 1, a reflective multilayer film (Si/Mo reflective multilayer film) is formed on the deposition face of the substrate 1, and the number of particles on the reflective multilayer film is measured by using a defect tester, whereupon the number of particles is 0.5 particle/cm$^2$, and it is confirmed that substantially no particles are generated at the time of depositing the reflective multilayer film.

Then, in the same manner as in Example 1, an absorbing layer (TaN layer) is deposited on the reflective multilayer film deposited by the above operations to obtain an EUV mask blank. The number of particles on the surface of the absorbing layer of the obtained EUV mask blank is 1.0 particle/cm$^2$ as measured in the same manner as above, and the EUV mask blank is confirmed to be an EUV mask blank having a small number of surface defects by particles.

Comparative Example

Comparative Example is the same as Example 1 except that the conductive film formed on the glass substrate is a Cr film (containing no B). The deposition conditions for the Cr film are as follows.
Target: Cr target
Sputtering gas: Ar gas (gas pressure: 0.3 Pa)
Electric power applied: 300 W
Deposition rate: 0.5 nm/sec
Film thickness: 100 nm The sheet resistance of the conductive film is measured, whereupon it is confirmed to be 5.5 Ω/□. The surface hardness of the conductive film is measured, whereupon it is confirmed to be 11.0 GPa.

Further, in the same manner as in Example 1, a reflective multilayer film (Si/Mo reflective multilayer film) is formed on the deposition face of the substrate, and the number of particles on the reflective multilayer film is measured by using a defect tester, whereupon the number of particles is 50 particles/cm$^2$, and it is confirmed that a very large number of particles are generated at the time of depositing the reflective multilayer film.

Then, in the same manner as in Example 1, an absorbing layer (TaN layer) is deposited on the reflective multilayer film deposited by the above operations to obtain an EUV mask blank. The number of particles on the surface of the absorbing layer of the obtained EUV mask blank is 100 particles/cm$^2$ or more as measured in the same manner as above, and the EUV mask blank is confirmed to be an EUV mask blank having a large number of surface defects by particles.

As evident from the above results, in Examples 1 to 4 wherein the conductive film contains B at an average concentration of from 1 to 70 at %, the surface hardness of the conductive film is high as compared with Comparative Example. Further, generation of particles is remarkably reduced in reflective multilayer films and EUV mask blanks formed by using the substrates with a conductive film in Examples 1 to 4 as compared with the reflective multilayer film and the EUV mask blank formed by using the substrate with a conductive film in Comparative Example.

The present invention is suitable as a reflective mask blank for EUV lithography to be used in production of semiconductors, etc., and a substrate with a conductive film to be used for production of such a mask blank.

The entire disclosure of Japanese Patent Application No. 2005-357858 filed on Dec. 12, 2005 including specification, claims, drawings and summary is incorporated herein by reference in its entirety.

The invention claimed is:

1. A substrate with a conductive film for a reflective mask blank for EUV lithography comprising:
a substrate;
a conductive film formed on a face of the substrate and comprising a chief material and B, the chief material comprising at least one member selected from the group consisting of Cr, Ti, Zr, Nb, Ni and V, the B having an average concentration of from 1 to 70 at % wherein the conductive film further contains N at an average concentration of from 1 to 60 at %; and
a reflective multilayer film formed on a face of the substrate on an opposite side of the face on which the conductive film is formed.

2. The substrate with a conductive film according to claim 1, wherein the conductive film is a gradient composition film wherein the B concentration in the conductive film changes along the thickness direction of the conductive film so that the average B concentration is low on the substrate side and the average B concentration is high on the surface side.

3. The substrate with a conductive film according to claim 2, wherein the gradient composition film has an average B concentration of at most 15 at % at a portion within a film thickness of 5 nm from the face on the substrate side, and an average B concentration of from 1 to 70 at % at a portion within at least a film thickness of 5 nm from the surface.

4. The substrate with a conductive film according to claim 1, wherein the conductive film has an average N concentration of at most 10 at % at a portion within at least a film thickness of 5 nm from a surface.

5. The substrate with a conductive film according to claim 1, wherein the conductive film has an oxygen concentration of at most 5 at %.

6. The substrate with a conductive film according to claim 2, wherein the conductive film has an oxygen concentration of at most 5 at %.

7. The substrate with a conductive film according to claim 1, wherein the conductive film has a sheet resistance of from 0.1 to 100 Ω/□.

8. The substrate with a conductive film according to claim 1, wherein the conductive film is in such a state that at least one member selected from the group consisting of Cr, Ti, Zr, Nb, Ni and V, and a compound of B selected from the group consisting of $CrB_2$, $TiB_2$, $ZrB_2$, $NbB_2$, $NiB_2$ or $VB_2$ coexist.

9. The substrate with a conductive film according to claim 1, wherein the conductive film has an amorphous crystal structure.

10. The substrate with a conductive film according to claim 1, wherein the conductive film has a surface hardness of at least 12 GPa.

11. The substrate with a conductive film according to claim 1, wherein the smoothness on the surface of the conductive film is at most 0.5 nm by Rms (root-mean-square roughness).

12. The substrate with a conductive film according to claim 1, wherein the conductive film has a thickness of from 10 to 500 nm.

13. A reflective mask blank for EUV lithography, which comprises the substrate with a conductive film as defined in claim 1 and an absorbing layer formed on the reflective multilayer film.

14. A reflective mask for EUV lithography, which is prepared by forming a pattern on the reflective mask blank for EUV lithography as defined in claim 13.

* * * * *